United States Patent [19]
Tsuzuki et al.

[11] Patent Number: 5,340,409
[45] Date of Patent: Aug. 23, 1994

[54] PHOTOVOLTAIC ELEMENT AND METHOD FOR FORMING THE SAME

[75] Inventors: Koji Tsuzuki; Nobuyoshi Takehara, both of Nagahama, Japan

[73] Assignee: Canon Kabushiki Kaisha, Tokyo, Japan

[21] Appl. No.: 46,131

[22] Filed: Apr. 15, 1993

[30] Foreign Application Priority Data

Apr. 23, 1992 [JP] Japan .................. 4-130066

[51] Int. Cl.⁵ .................. H01L 31/0224; H01L 31/04; H01L 31/18
[52] U.S. Cl. .................. 136/256; 136/258; 437/2; 437/4; 437/188; 257/746; 257/749
[58] Field of Search .................. 136/256, 258 AM; 437/2–5, 181, 187–188; 257/746, 749

[56] References Cited

U.S. PATENT DOCUMENTS

| | | | |
|---|---|---|---|
| 4,084,985 | 4/1978 | Evans, Jr. ................. | 136/251 |
| 4,293,451 | 10/1981 | Ross ........................ | 252/512 |
| 4,968,354 | 11/1990 | Nishiura et al. ........ | 136/244 |

FOREIGN PATENT DOCUMENTS

| | | | |
|---|---|---|---|
| 3804831 | 7/1989 | Fed. Rep. of Germany ...... | C09C 5/24 |
| 1-149484 | 6/1989 | Japan ........................... | 136/244 |

OTHER PUBLICATIONS

"Thick Film Screen Printable Silver Conductor Pastes," Product Bulletin C-332-1, Thick Film Systems, Santa Barbara, Calif.

K. A. Baert et al, *IEEE Trans. Electron Devices,* vol. 37, No. 3, Mar. 1990, pp. 702–707.

Patent Abstracts of Japan, vol. 12, No. 330(E-655), Sep. 7, 1988, & JP-A-63 093 164 (Matsushita Electric Ind Co Ltd) Apr. 23, 1988.

Patent Abstracts of Japan, vol. 12, No. 461(E-689) Dec. 5, 1988, & JP-A-63 185 071 (Matsushita Electric Ind Co Ltd) Jul. 30, 1988.

Patent Abstracts of Japan, vol. 12, No. 461(E-955) Jul. 25, 1990, & JP-A-21 17 177 (Fuji Electric Co Ltd) May 1, 1990.

Patent Abstracts of Japan, vol. 13, No. 264(E-774) Jun. 19, 1989, & JP-A-10 57 762 (Kyocera Corp) Mar. 6, 1989.

Patent Abstracts of Japan, vol. 15, No. 170(E-1062) Apr. 30, 1991, & JP-A-30 38 069 (Fuji Electric Co Ltd) Feb. 19, 1991.

*Primary Examiner*—Aaron Weisstuch
*Attorney, Agent, or Firm*—Fitzpatrick, Cella, Harper & Scinto

[57] ABSTRACT

A photovoltaic element has a photoelectric conversion layer and a collecting electrode formed thereon by curing a paste having at least an electroconductive base substance and a curable resin formed on the photoelectric conversion layer. The number average molecular weight of the curable resin is 3000 or less.

7 Claims, 4 Drawing Sheets

PHOTOVOLTAIC ELEMENT AND METHOD FOR FORMING THE SAME

BACKGROUND OF THE INVENTION

1. Field of the Invention

The present invention relates to a semiconductor element having a superior weatherproof collecting electrode, and particularly to a photovoltaic element which is easy to fabricate and has long-term waterproofing reliability, as well as a forming method thereof.

2. Related Background Art

In recent years, there has been growing interest in the environment and energy problems such as global heating and radioactive contamination caused by several atomic power plant accidents. In these situations, solar cells using a photovoltaic semiconductor element (hereinafter also referred to as a photoelectric conversion element) have been expected to be used worldwide as a reproducible, inexhaustible clean energy source. At present, three types of solar cells are well known: single crystal silicon type, polycrystalline silicon type, and amorphous silicon type. An amorphous silicon type solar cell is one of the most promising solar cells, because it has excellent characteristics such as easy formation of large area cells and usefulness with thin films due to its great light absorption coefficient, unlike crystalline type solar cells, although it is inferior in conversion efficiency to crystalline type solar cells. Thus, much research on the amorphous silicon type has been made worldwide, because if the amount of photovoltaic power generation reaches several hundreds MW, its cost is estimated to be significantly less than the crystalline types.

An example of a conventional solar cell is shown in FIG. 6. Photoelectric conversion layer 103 made of an amorphous silicon is formed on electrically conductive substrate 104, and transparent electrically conductive layer 102, also useful as an anti-reflection layer, is formed thereon. Further, on the transparent electrically conductive layer there is formed collecting grid electrode 101 for collecting current more effectively. If light is incident on the photoelectric conversion layer 103 from the side of the collecting electrode 101, as shown in FIG. 6, light energy is converted into electric current within the photoelectric conversion layer, and outputted from the collecting electrode 101 and the electrically conductive substrate 104. The photoelectric conversion layer contains at least one or more pin junctions, with the p-side acting as an anode and the n-side as a cathode.

In general, solar cells having an output of several watts or greater are used outdoors. Therefore, these solar cells are required to have durability against temperature and humidity, i.e. be environment-proof.

In particular, when the collecting electrode is formed on the non-single crystal photovoltaic semiconductor layer, it must be formed in a large area at a temperature which does not damage the quality of the film of the semiconductor, whereby an electroconductive paste is used.

In the conventional solar cell shown in FIG. 6, there are a number of voids or interstices 105 of various sizes formed in the collecting electrode 101. In the atmosphere, moisture permeates such voids or interstices and dissolves the electroconductive base substance, such as silver, contained in the collecting electrode due to the photovoltaic EMF of the solar cell itself. Such dissolved electroconductive base substance may diffuse and grow through defective portions such as pinholes in the semiconductor, causing a short-circuit between the positive and negative electrodes of the solar cell and resulting in greatly decreased conversion efficiency. For example, when the electroconductive base substance is silver, a reaction occurs between the anode and the cathode, according to the following formula, thereby giving rise to a short-circuit.

Anode $Ag_2O + H_2O \rightarrow 2Ag^+ + 2OH^-$

Cathode $Ag^+ + e^- \rightarrow Ag$ (dendritic crystal deposition)

This behavior is shown in FIG. 7. Silver ions 605 produced by the reaction between $Ag_2O$ and water within the collecting electrode 101 of the anode side enter pinhole 606 existing in the photoelectric conversion layer 103 due to the electromotive force produced by the photovoltaic element, adhering to the electrically conductive substrate 104 to form dendritic crystal 607. If the dendritic crystal 607 grows, the collecting electrode 101 and the electrically conductive substrate 104 of the solar cell are short-circuited, thereby decreasing the conversion efficiency. If the reaction further progresses, output of the solar cell cannot be obtained.

This electromigration phenomenon is not limited to silver, but can occur with copper, solder, and gold.

In view of the above-described problem, an object of the present invention is to provide a photovoltaic element which has high environment proofing, and especially is easy to make with conversion efficiency not degrading because of permeation of water.

SUMMARY OF THE INVENTION

In order to accomplish the above-mentioned object, the present invention provides a photovoltaic element having a photoelectric conversion layer and a collecting electrode formed by curing a paste having at least a conductive base substance and a curable resin on said photoelectric conversion layer, wherein the number average molecular weight of said curable resin is 3000 or less, wherein the weight percent of said electroconductive base substance to said collecting electrode is 70% or more, and wherein said curable resin contains at least one resin of urethane type, epoxy type, polyimide type, polyester type, phenol type, vinyl type, and acrylic type.

Also, the present invention provides a method for forming a photovoltaic element, wherein said curing is performed in a range from 120° C. to 250° C., wherein said electroconductive base substance is one of silver, silver-palladium alloy, a mixture of silver and carbon, copper, nickel, aluminum, and gold, and wherein said photovoltaic element comprises a non-single crystal semiconductor, further including the steps of forming a paste having an electroconductive base substance and a curable resin having a number average molecular weight of 3000 or less on said photoelectric conversion layer, and forming a collecting electrode by curing said paste.

DETAILED DESCRIPTION OF THE PREFERRED EMBODIMENTS

Figure 1:
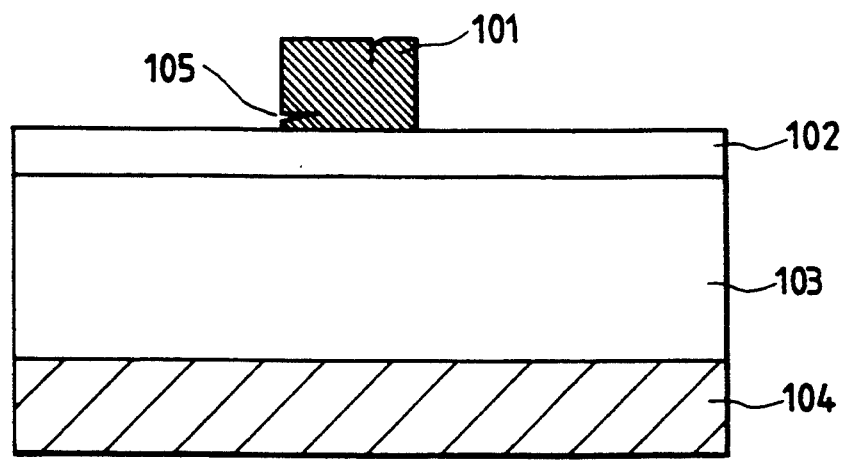
FIG. 1 is a cross-sectional view of a typical photovoltaic element having a collecting electrode according to the present invention.

As previously described, if some voids or interstices exist in a collecting electrode, moisture from the exterior may react with the electroconductive base substance such as silver, producing silver ions and then dendritic silver to cause a short-circuit between the electrodes.

In the present invention, the curable resin of the electroconductive paste has a number average molecular weight of 3000 or less, with a greater flowability of the resin, and the resin extends across the collecting electrode, which makes it difficult to produce voids or interstices. Accordingly, water is less liable to reach the electroconductive base substance, so that it is possible to suppress the reaction represented by the chemical formula (A) as previously noted, and thus the creation of silver ions. As a result, it is possible to prevent short-circuits between the electrodes.

Even if silver ions are produced, the curable resin having a number average molecular weight of 3000 or less has a greater flowability, which causes the resin to penetrate, whereby it becomes difficult for silver ions to reach the transparent conductive layer, thereby making it possible to prevent short-circuits.

Moreover, because of the great flowability of the resin, it is easy to form the paste on the photoelectric conversion layer by screen printing.

As above described, according to the present invention, it is possible to provide a photovoltaic element which is unlikely to experience electromigration and has excellent environment-proofing. Also, since the conversion efficiency is not degraded, the cost of the photovoltaic element can be reduced.

A solar cell according to the present invention is made in the following way, when an amorphous silicon layer deposited on a conductive substrate is used as the photoelectric conversion semiconductor layer.

On the conductive substrate, an amorphous silicon layer having one or more pin junctions is formed by plasma CVD using silane gas, for example. Preferable examples of the conductive substrate include stainless steel, aluminum, copper, titanium, carbon sheet, etc. Also, the substrate may be a resin substrate having a metal layer deposited thereon. Subsequently, on the silicon layer there is formed a transparent conductive layer made of indium oxide or tin oxide by vapor deposition or spraying.

Next, an electroconductive paste composed of an electroconductive base substance and a curable resin is applied on the transparent conductive layer by screen printing, and cured at a temperature ranging from 100° C. to 200° C. to form a collecting electrode.

Examples of the electroconductive base substance in the electroconductive paste include silver, silver-palladium alloy, a mixture of silver and carbon, copper, nickel, aluminum, gold, etc. The grid-shaped electrode preferably contains an electroconductive base substance in at least 70 wt %, and more preferably 75 wt % or greater, in order to obtain sufficient electrical conductivity. Preferable examples of the curable resin include urethane type, epoxy type, polyimide type, polyester type, phenol type, vinyl type, and acrylic type, whose number average molecular weight is 3000 or less. Particularly, the epoxy type is most preferable from the viewpoint of waterproofing and economy. Since impurities such as chlorine or sodium contained in the electroconductive paste will act as a catalyst in the above-mentioned electromigration reaction and promote the creation of metallic ions, it is preferable that the paste contain the least amount of impurities possible.

Also, the extent of voids or interstices in the collecting electrode generally depends on the kind of resin for forming the collecting electrode, as well as the temperature and time of forming, but if a sufficient cure time is given at a temperature of 120° C. or greater, the crosslinking degree of the resin is not substantially changed, resulting in little change in the extent of voids or interstices. Further, when paste is used as the collecting electrode for the photovoltaic layer which is made of an amorphous semiconductor, the forming temperature is substantially in a range from 120° C. to 250° C., depending on the kind of resin. At temperatures of 120° C. or below, the crosslinking of the resin in the paste is insufficient such that electrical conductivity or adhesion may be reduced, while at temperatures of 250° C. or above, the quality of the amorphous semiconductor film is degraded.

The present invention will be now described in detail by way of examples. Note that the number average molecular weight of the curable resin in the present invention was measured by gel permeation chromatography (GPC). The gel permeation chromatography technique used herein relies on the property that an adsorbent can adsorb more sample having smaller molecular weight. Therefore, the measurement sample is passed through a thermostatically held column of adsorbent, whereby the average molecular weight is determined by the adsorbed amount and the time.

EXAMPLE 1

Two pin-type photoelectric conversion layers composed of an amorphous silicon were deposited by plasma CVD on a stainless steel substrate having a thickness of 8 mils and an area of 16 cm$^2$, and a transparent conductive layer composed of indium oxide was deposited thereon by sputtering.

Then, an electroconductive paste composed of a urethane type resin and silver particulates (70 wt % electroconductive base substance, 20 wt % urethane type resin with a number average molecular weight of 2010), and 10 wt % solvent (methyl ethyl ketone) was screen printed into a desired shape, and cured at a temperature of 130° C. for one hour to form the solar cell of this example. This solar cell is referred to as a tandem type, its optimal operational voltage being 1.2 V. A forward bias of 1.2 V was applied to the solar cell under conditions of high temperature of 85° C. and high humidity of 85%RH to measure the temporal change of leakage current flowing within the solar cell. The forward bias was applied to simulate the operational state. The measurement result is indicated by the solid line A in FIG. 2. The ordinate of FIG. 2 indicates the leakage current per unit area, and the abscissa indicates the time.

COMPARATIVE EXAMPLE

Figure 2:
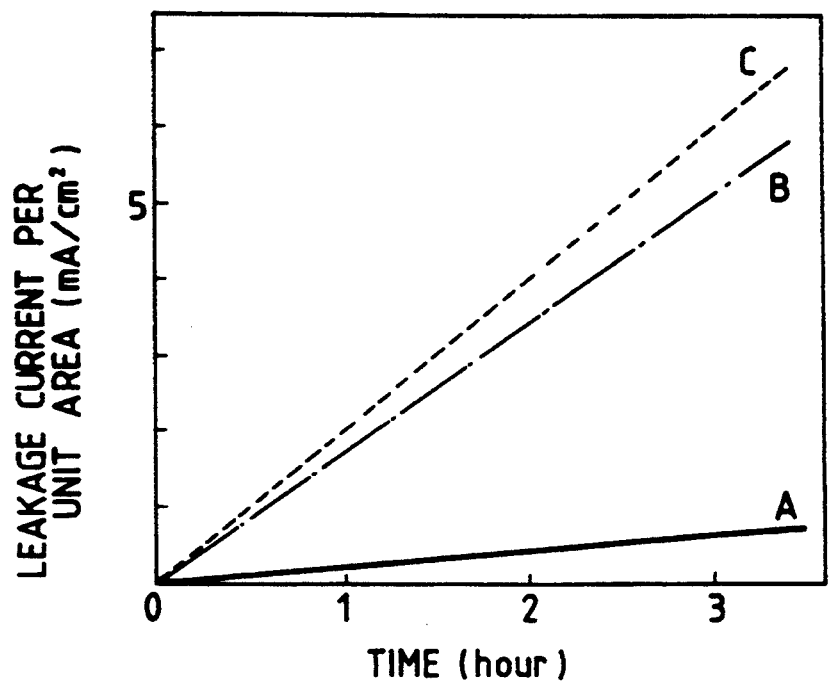
FIG. 2 is a graphic representation of the temporal change of leakage current flowing through photovoltaic elements using the collecting electrodes of Example 1 and a comparative example.

As comparative examples, using (1) an electroconductive paste composed of a polyimide type resin (with a number average molecular weight of 14400) and silver particulates and (2) an electroconductive paste composed of a polyester type resin (with a number average molecular weight of 31000) and silver particulates, solar cells were fabricated under the same conditions as in Example 1, and the same test as described above was performed. The results are shown in FIG. 2. In FIG. 2, the polyimide type resin (with a number average molecular weight of 14400) is indicated by the dot-and-dash line B, while the polyester type resin (with a number average molecular weight of 31000) is indicated by the broken line C.

As can be seen from FIG. 2, the leakage currents of the solar cells in the comparative examples greatly increased to 1.7 mA/cm$^2$ per hour for the polyimide type, and 2 mA/cm$^2$ per hour for the polyester type, while that of the solar cell of Example 1 is 0.2 mA/cm$^2$ per hour, which is about 1/10 that of the comparative examples, indicating that the elution of silver has been greatly reduced.

EXAMPLE 2

In the same way as in Example 1, a tandem-type solar cell was fabricated using a paste composed of an epoxy type resin and silver particulates (80 wt % electroconductive base substance, 20 wt % epoxy resin with a numbher average molecular weight of 540, solventless). The curing conditions were 150° C. and three hours.

Figure 3:
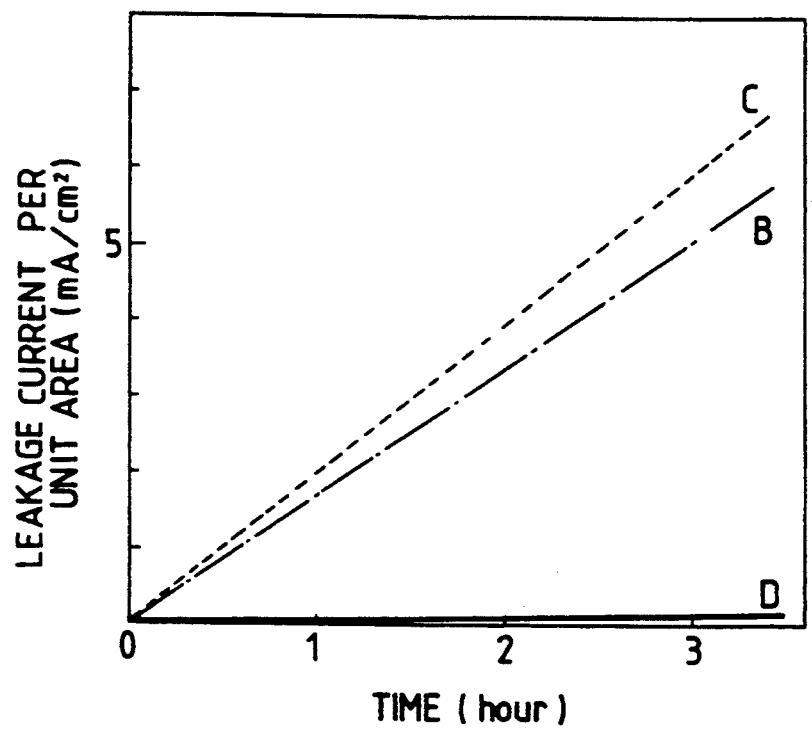
FIG. 3 is a graphic representation of the temporal change of leakage current flowing through photovoltaic elements using the collecting electrodes of Example 2 and a comparative example.

In the same way as in Example 1, a forward bias was applied to the solar cell under conditions of high temperature of 85° C. and high humidity of 85%RH to measure the increased amount of leakage current. This result is shown in FIG. 3 together with that of the comparative examples. In FIG. 3, the solid line D indicates the leakage current in this example, while the dot-and-dash line B and the dotted line C respectively indicate the temporal changes of leakage current for the polyimide type resin (with a number average molecular weight of 14400) and the polyester type resin (with a number average molecular weight of 3100) of the comparative examples as shown in FIG. 2.

In this example, the increase in leakage current was 0.03 mA/cm$^2$ per hour, which was about 1/100 that of the comparative example. This is substantially 1/10 that of Example 1, which indicates that further beneficial effects can be expected by using an electroconductive paste composed of a resin having a smaller number average molecular weight.

EXAMPLE 3

Figure 4:
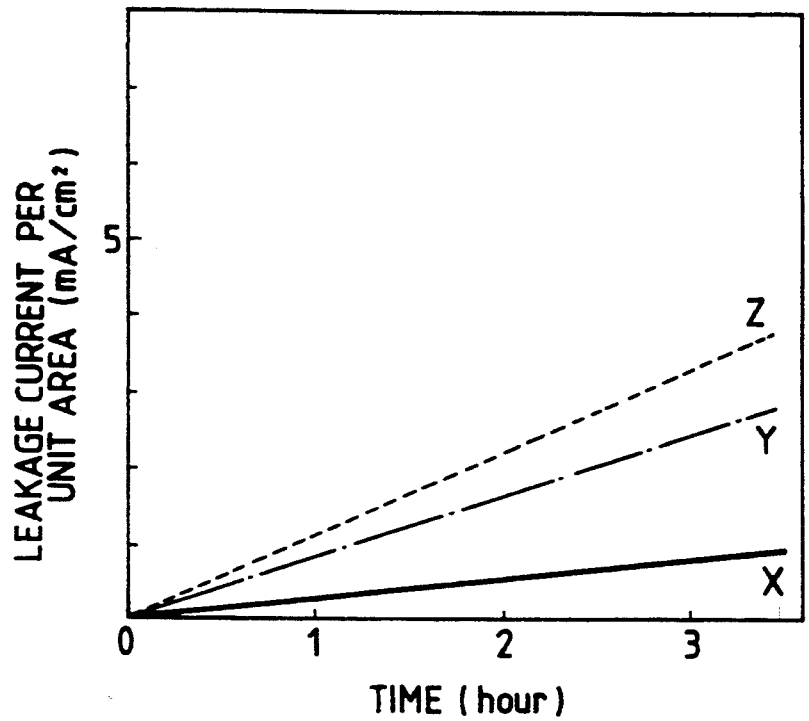
FIG. 4 is a graphic representation of the temporal change of leakage current flowing through photovoltaic elements using the collecting electrodes of Example 3.

Using a paste composed of an unsaturated polyester type resin and silver particles tandem-type amorphous solar cells X, Y, and Z of the polyester type resin were fabricated in the same way as in Example 1, except that the number average molecular weight of unsaturated polyester type resin was 2900 for X, 3350 for Y, and 5000 for Z. In the same way as in Example 1, a forward bias was applied to the solar cells under conditions of high temperature of 85° C. and high humidity of 85%RH to measure the temporal change of leakage current. The results are shown in FIG. 4. In FIG. 4, the solid line X indicates the temporal change of leakage current when using a paste wherein the number average molecular weight of unsaturated polyester type resin is 2900, the dotted line Y indicates the temporal change of leakage current when using a paste wherein the number average molecular weight of unsaturated polyester type resin is 3350, and the dot-and-dash line Z indicates the temporal change of leakage current when using a paste wherein the number average molecular weight of unsaturated polyester type resin is 5000.

The rate of leakage current increase is a very small value such as 0.25 mA/cm$^2$ per hour when using a paste as indicated by the solid line X, with a very small migration of silver. In contrast, the rate of leakage current increase when using pastes indicated by the dotted line Y and the dot-and-dash line Z which have greater molecular weights, and in particular, when using a paste indicated by the dot-and-dash line Z, is 1.1 mA/cm$^2$ per hour, which is roughly four to five times that of the paste as indicated by the solid line X. This suggests that even though the same unsaturated polyester type resin is used, the amount of elution of silver will vary depending on the molecular weight, providing different characteristics as to migration resistance.

Figure 5:
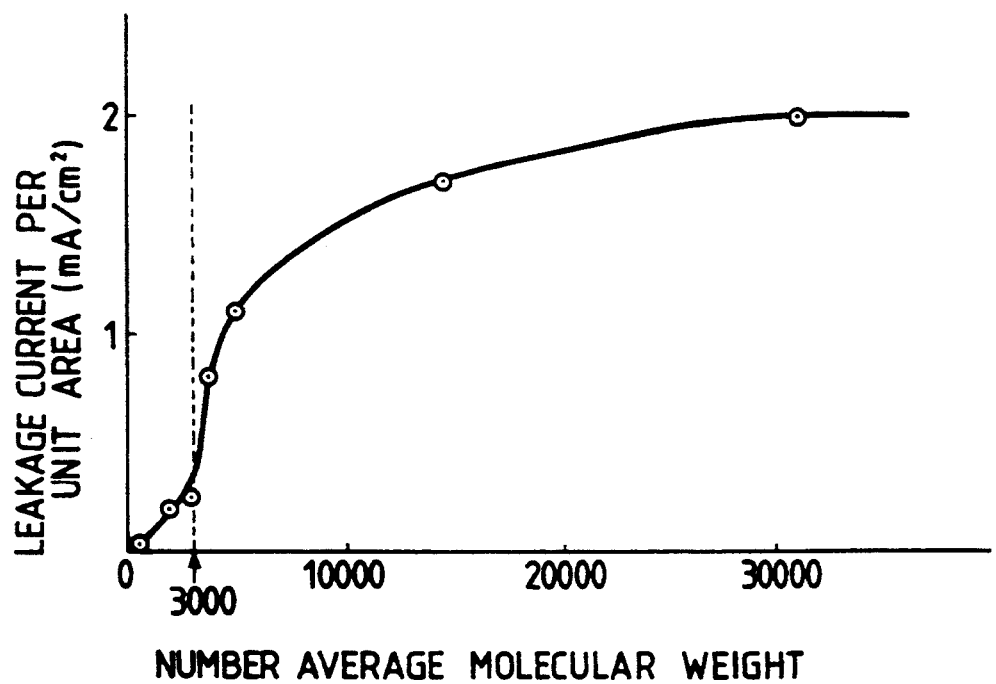
FIG. 5 is a graphic representation of the relation between the number average molecular weight and the leakage current of photovoltaic elements having collecting electrodes using an electroconductive paste.
Figure 6:
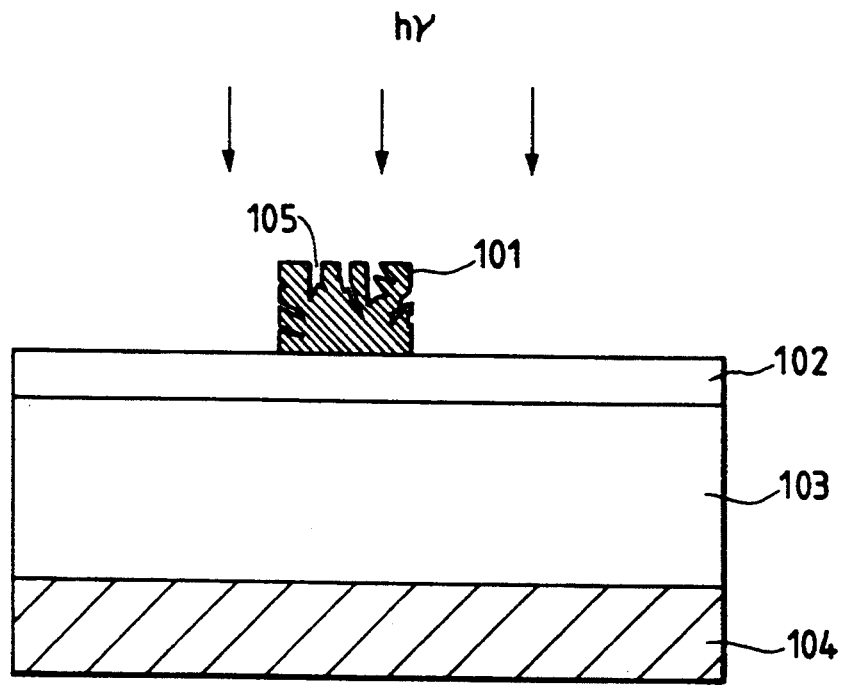
FIG. 6 is a cross-sectional view of a conventional photovoltaic element using a collecting electrode.
Figure 7:
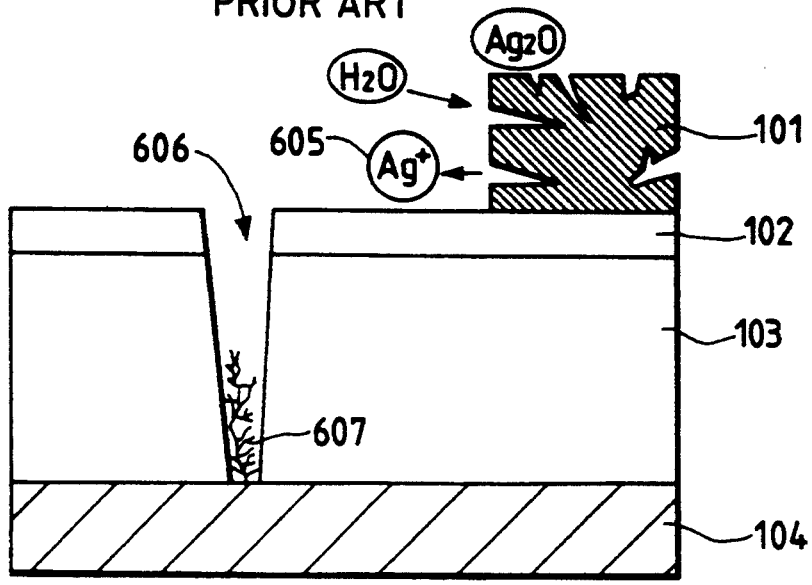
FIG. 7 is an explanatory view of the principle of degradation in the conventional photovoltaic element using the collecting electrode.

The results of Examples 1 to 3 and the comparative example as above described are listed in Table 1 and FIG. 5.

TABLE 1

| Resin | Number average molecular weight | Increase of leakage current (mA/cm$^2$) | Evaluation |
| --- | --- | --- | --- |
| Epoxy | 540 | 0.03 | ○ |
| Urethane | 2010 | 0.2 | ○ |
| Unsaturated polyester | 2900 | 0.25 | ○ |
| Unsaturated polyester | 3350 | 0.8 | Δ |
| Unsaturated polyester | 5000 | 1.1 | x |
| Polyimide | 14400 | 1.7 | x |
| Polyester | 31000 | 2.0 | x |

○: good
Δ: fair
x: poor

As can be seen from FIG. 5, there is a marked difference in the rate of increase of leakage current between a paste using a resin with a number average molecular weight of 3000 or less and a paste using a resin with a number average molecular weight of 3000 or greater, and the paste with a number average molecular weight of 3000 or less has an excellent migration resistance characteristic. Also, it can be seen than greater effects can be obtained with a smaller number average molecular weight.

According to the present invention, the use of a collecting electrode composed of a resin having a number average molecular weight of 3000 or less makes it possible to prevent short-circuits between electrodes of a photovoltaic element from occurring due to permeation of water, and to provide a solar cell which is easy to fabricate and is environment-proof.

Also, because the collecting electrode is composed of a mixture of a resin and an electroconductive base substance, the grid can be formed at low temperatures, whereby it is possible to fabricate a solar cell inexpensively.

Further, since the grid containing a resin according to the present invention is bendable and durable against mechanical impacts, it is possible to provide a photovoltaic element which is flexible and rugged.

As above described, according to the present invention, it is possible to form a solar cell excellent in environment-proofing at lower cost, and the industrial utility is quite exceptional.

What is claimed is:

1. A photovoltaic element having a photoelectric conversion layer and a collecting electrode formed thereon by curing a paste having at least an electroconductive base substance and a curable resin formed on said photoelectric conversion layer, characterized in that the number average molecular weight of said curable resin is 3000 or less.

2. The photovoltaic element according to claim 1, characterized in that the weight percent of said electroconductive base substance to that of said collecting electrode is 70% or more.

3. The photovoltaic element according to claim 1, characterized in that said curable resin contains at least one resin of urethane type, epoxy type, polyimide type, polyester type, phenol type, vinyl type, and acrylic type.

4. The photovoltaic element according to claim 1, characterized in that said curing is performed in a temperature range of from 120° C. to 250° C.

5. The photovoltaic element according to claim 1, characterized in that said electroconductive base substance is one of silver, silver-palladium alloy, a mixture of silver and carbon, copper, nickel, aluminum, and gold.

6. The photovoltaic element according to claim 1, characterized in that said photovoltaic element comprises a non-single crystal semiconductor.

7. A method for forming a photovoltaic element having a photoelectric conversion layer, including the steps of:

forming a paste having an electroconductive base substance and a curable resin having a number average molecular weight of 3000 or less on said photoelectric conversion layer; and forming a collecting electrode by curing said paste.

* * * * *

UNITED STATES PATENT AND TRADEMARK OFFICE
CERTIFICATE OF CORRECTION

PATENT NO. : 5,340,409
DATED : August 23, 1994
INVENTOR(S) : KOJI TSUZUKI, ET AL.

It is certified that error appears in the above-identified patent and that said Letters Patent is hereby corrected as shown below:

COLUMN 2

Line 13, "ions" should read --ion--.
    Line 15, "enter" should read --enters--.

COLUMN 3

Line 52, "environment-proofing-" should read --environment-proofing.--.

COLUMN 5

Line 39, "numbher" should read --number--.
    Line 52, "3100)" should read --31000)--.

Signed and Sealed this

Eleventh Day of April, 1995

Attest:

BRUCE LEHMAN

Attesting Officer      Commissioner of Patents and Trademarks